United States Patent [19]

Shimanek et al.

[11] Patent Number: 5,684,413
[45] Date of Patent: Nov. 4, 1997

[54] CONDENSED SINGLE BLOCK PLA PLUS PAL ARCHITECTURE

[75] Inventors: Schuyler E. Shimanek; Thomas J. Davies, both of Albuquerque, N. Mex.

[73] Assignee: Philips Electronics North America Corp., New York, N.Y.

[21] Appl. No.: 623,622

[22] Filed: Mar. 28, 1996

[51] Int. Cl.[6] .................................. H03K 19/177
[52] U.S. Cl. .................................. 326/41; 326/47
[58] Field of Search .................................. 326/39, 41, 44, 326/47

[56] References Cited

U.S. PATENT DOCUMENTS

| Re. 34,444 | 11/1993 | Kaplinsky | 340/825.8 |
|---|---|---|---|
| 5,235,221 | 8/1993 | Douglas et al. | 326/41 X |
| 5,471,155 | 11/1995 | Steele | 326/41 X |

Primary Examiner—David R. Hudspeth
Attorney, Agent, or Firm—Brian J. Wieghaus

[57] ABSTRACT

A condensed single block PAL plus PLA architecture utilizing a rectangular shape is shown. By interleaving the ORterms of the PLA array with the Pterms of the PAL array, a significant amount of die space is saved when incorporating the circuit with silicon. The decode routing required is now simplified and the propagation delay skews through the array are also reduced.

5 Claims, 4 Drawing Sheets

CONDENSED SINGLE BLOCK PLA PLUS PAL ARCHITECTURE

BACKGROUND OF THE INVENTION

1. Field of the Invention

The present invention relates to programmable logic array architectures. More particularly, it relates to a single block PAL plus PLA architecture.

2. The Prior Art

The basic building blocks of a programmable logic device (Pld) are the Product-term and the ORterm. Within each of these terms exists several programmable logic blocks (cells). When the outputs of several such cells are 'ANDed' the term is called a 'Product-term', and when outputs are "ORed' the term is called an 'ORterm'.

The construction of a programmable logic array requires the joining of two array blocks commonly known as a 'PAL' and 'PLA' array. The construction of the 'PAL' array is made by stacking several product-terms and 'ORing' sequential clusters of their outputs into a fixed width OR gate. The construction of the 'PLA' array is similar to that of the 'PAL' array except the output of each product-term functions as an input to an array of ORterms.

The basic PLD contains a single PAL array or PLA array, or one of each. When constructing complex PLDs (CPLDs), multiple blocks of PAL and PLA arrays are used. These array structures are generally L-shaped, and as such, prevent the efficient placement of multiple blocks of these arrays on silicon. Under this circumstance, not only is silicon die space wasted, but decode routing is more complicated, and propagation delays through the PLA become more skewed.

SUMMARY OF THE INVENTION

According to the invention, a rectangular shaped PAL plus PLA array is formed. The modified structure of the invention interleaves the ORterms within the PAL array. Therefore, rather than routing the outputs of the PLA array Product-terms to the right, they are routed vertically through both arrays and feed the rotated ORterm inputs. In this way, valuable die space is conserved by placing the PLA ORterms within the PAL array, in addition to simplifying the decode routing.

It is therefore an object of the present invention to provide a condensed single block PAL plus PLA architecture that has a smaller die size.

It is another object of the invention to provide a condensed single block PAL plus PLA architecture that utilizes simplified interconnect routing between the PAL array, PLA array and the PLA ORterms within the PAL.

It is yet a further object of the invention to provide a condensed single block PAL plus PLA architecture that has reduced propagation delay skews.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
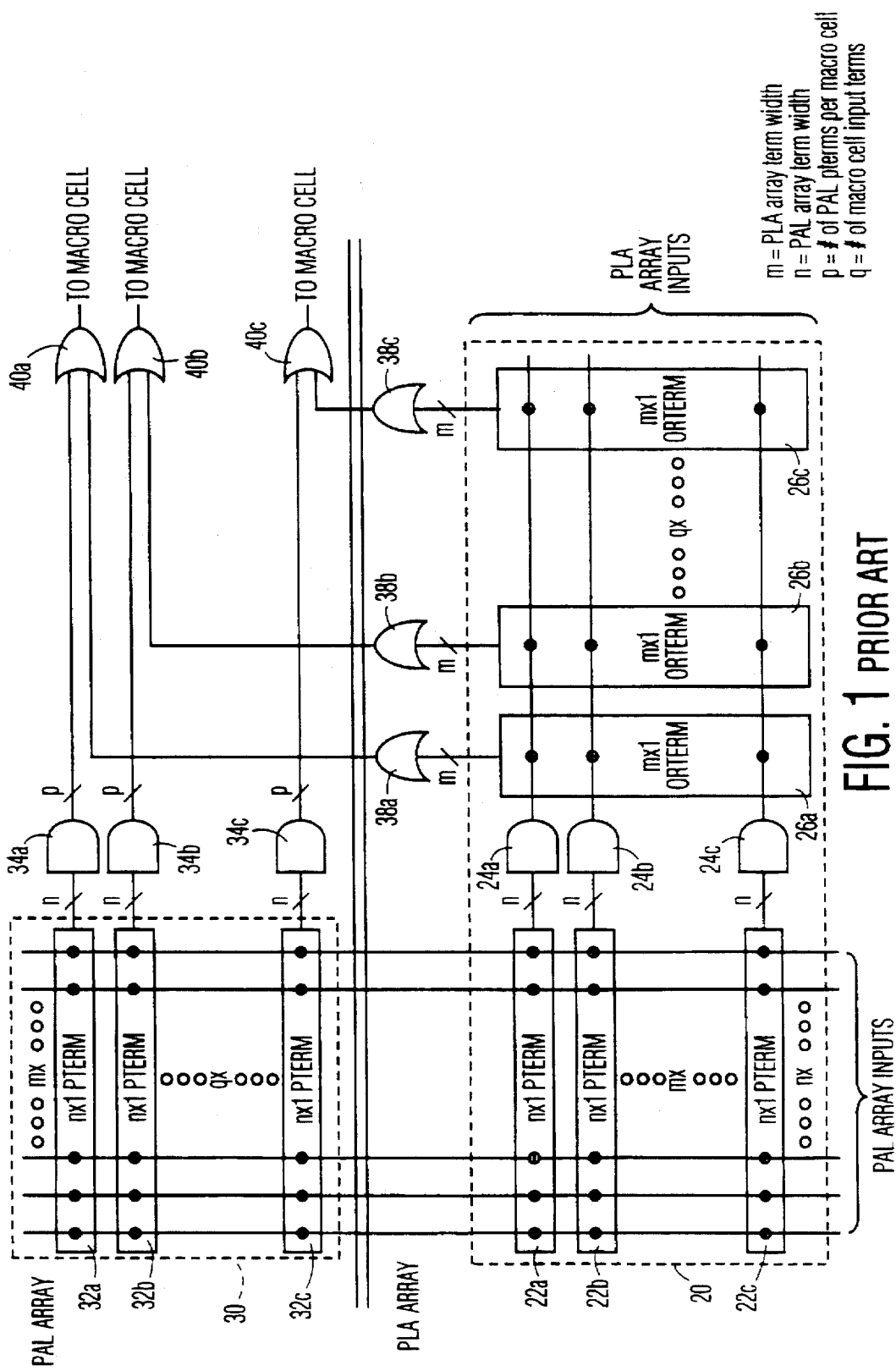
FIG. 1 is a block diagram of a PAL plus PLA architecture according to the prior art.

FIG. 1 shows a block diagram of a PAL plus PLA architecture according to the prior art. The PAL array 30 is situated above PLA array 20 in an L-shaped configuration. The PLA array 20 consists of Pterm elements 22a, 22b and 22c, arranged immediately under the Pterm elements 32a, 32b and 32c of PAL array 30. The outputs of Pterms 22a–22c are ANDed via gates 24a, 24b, and 24c, respectively, and fed into ORterms 26a, 26b, and 26c.

With the ORterms 26a–26c being arranged in this L-shaped configuration, the same basic shape results when situated on silicon, thus the efficient placement of multiple blocks of these arrays is not possible. In addition to the wasting of silicon die space, the decode routing required between the ORterms, the PLA array, and the PAL array is more complicated, and the propagation delays through the PLA path become more skewed.

Figure 2A:
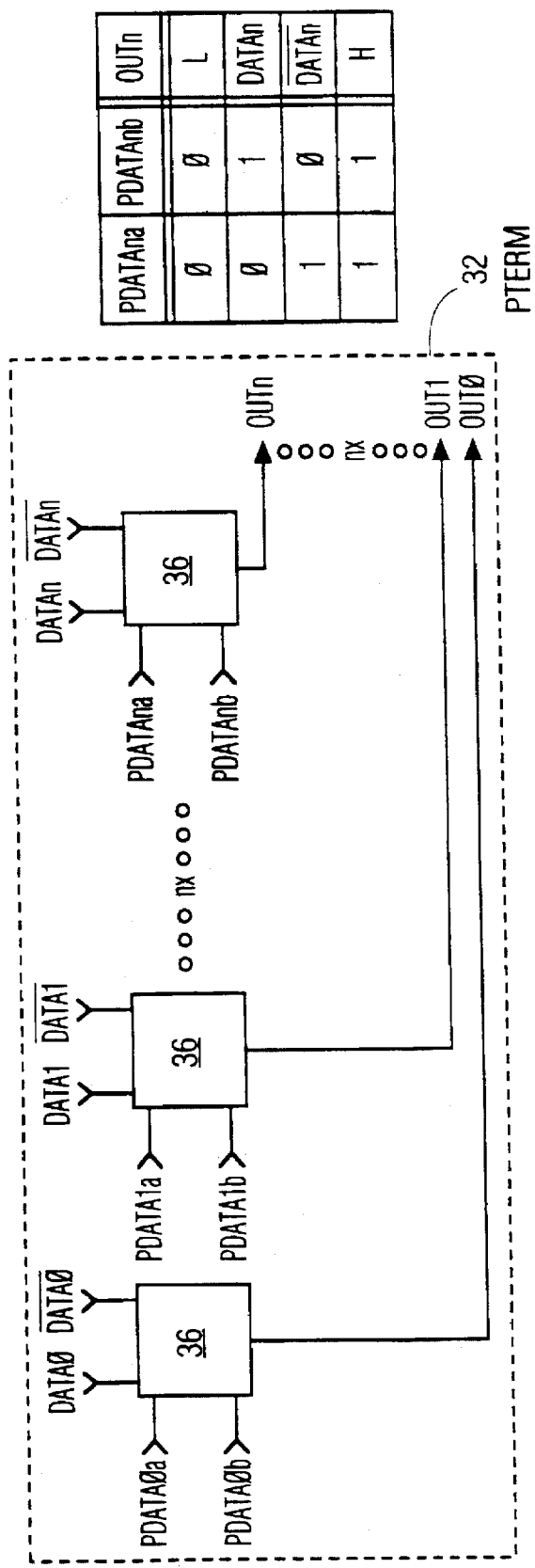
FIG. 2a is a block diagram of product-term programmable logic elements according to the invention.
Figure 2B:
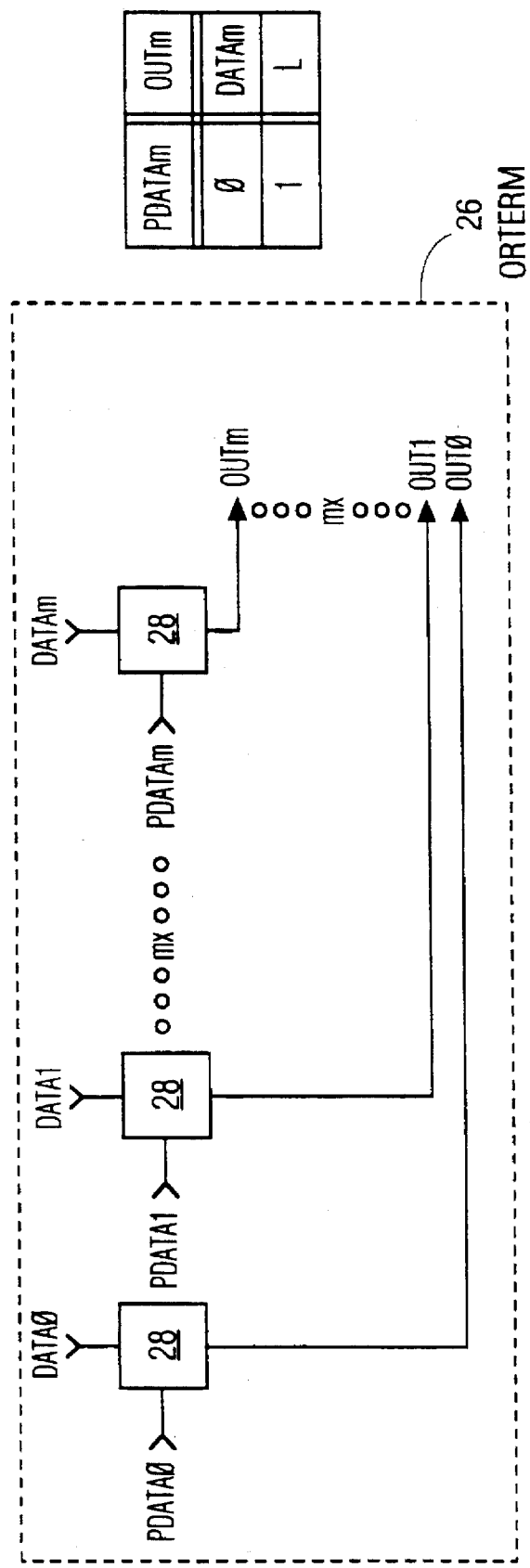
FIG. 2b is a block diagram of ORterm programmable logic elements according to the invention.

FIGS. 2a and 2b show block diagrams of the Product-term (Pterm) and ORterm logic elements 32 and 26, respectively. Pterm elements 32 also correspond to Pterm elements 22 in FIGS. 1 and 3. Within each of these terms exists several programmable logic blocks. For example, Pterm 32 consists of several programmable logic blocks 36, and ORterm 26 consists of several programmable logic blocks 28.

Pterms 36 each have two data inputs and two control inputs. The control inputs can also consist of memory element states. ORterms 28 each have one data input and one control input.

Figure 3:
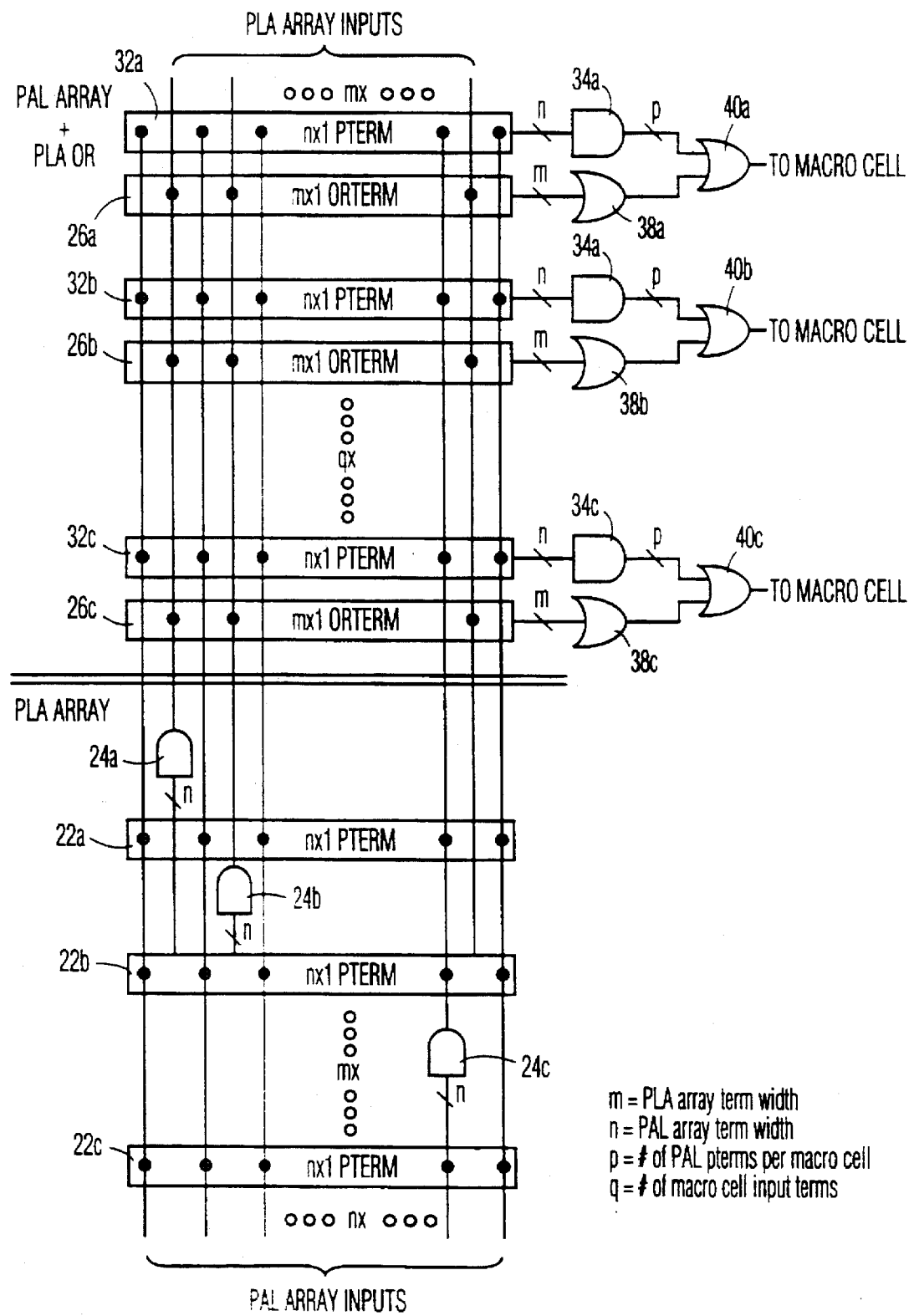
FIG. 3 is block diagram of the psquare or condensed PAL plus PLA architecture according to the invention.

FIG. 3 shows the condensed single block PAL plus PLA (PSQUARE) architecture according to the invention. In this embodiment, the ORterms 26a, 26b and 26c are evenly distributed among the Pterms of the PAL array, thereby forming the PAL array+PLA OR group. With this configuration, the AND gates 24a–24c are relocated to within the PLA array. The outputs of AND gates 24a–24c, of the Pterms 22a–22c, respectively, are fed vertically through both arrays into each of ORterms 26a–26c. Thus, the placement of the ORterms 26a–26c to the right of the PLA array is eliminated, and a significant amount of space is saved. This translates into a smaller die size needed to embody the circuit on silicon, and reduces the propagation delay skews associated with the interconnection of these elements.

The outputs of ORterms 26a–26c are fed into OR gates 38a–38c, respectively, and the outputs of the Pterms 32a–32c are fed into AND gates 34a–34c. The outputs of AND gate 34a and OR gate 38a are fed into OR gate 40a. The output of OR gate 40a feeds the macro cell being driven by this circuit. This same configuration applies for the remaining interleaved ORterms and Pterms.

By interleaving the PLA ORterms within the PAL Pterms, the outputs of the PLA array Pterms are connected vertically through both arrays to feed the rotated PLA ORterm inputs. This configuration simplifies the decode routing needed for this application. Since the PSQUARE architecture is a rectangular array, the advent of advanced integrated circuit techniques including multiple layers of metal, all programming decode routing and inter-array interconnection issues are solved without sacrificing valuable chip area.

In an alternative embodiment of the invention (not shown), the PLA product terms can be interleaved within the PAL product terms. This accomodates even spacing of the macro cells along the entire length of PAL plus PLA array.

While only a single embodiment of the present invention has been shown and described, it is to be understood that many changes and modifications may be made thereunto without departing from the spirit and scope of the invention as defined in the appended claims.

What is claimed is:

1. A condensed single block PLA plus PAL architecture comprising:

at least one PLA array having a plurality of Pterm elements each having an input and an output, and a plurality of AND gates each having and output, and an input coupled to one of said plurality of outputs of said Pterm elements;

at least one PAL array coupled to said at least one PLA array, said at least one PAL array having a plurality of Pterm elements each having an input and an output, and a plurality of AND gates each having an output, and an input coupled to one of said plurality of outputs of said Pterm elements of said PAL array;

a plurality of PLA ORterms disposed within said Pterm elements of said PAL array, each of said PLA ORterms having an output, and inputs coupled to said outputs of said AND gates of said PLA array, and a plurality of OR gates each having an output, and an input coupled to the output of said PLA ORterms; and a plurality of OR gates each having an output, and two inputs, one of said inputs for receiving one of the outputs of said AND gates of the PAL array, and the other of said inputs receiving the output of said OR gates of PLA ORterms, the output of said OR gate feeds a macro cell circuit connected to the condensed single block PLA plus PAL circuit.

2. The condensed single block PLA plus PAL architecture according to claim 1, wherein the outputs of said AND gates connected to the Pterm elements of the PLA array are coupled to the PLA ORterms disposed among said PAL array Pterms through said PLA array and PAL array, said coupling enabling the condensed single block PAL plus PLA circuit to be embodied in a smaller die area.

3. The condensed single block PLA plus PAL architecture according to claim 2, wherein the coupling of the PLA Pterms, via said AND gates, with the PLA ORterms within the PAL array reduces propagation delay skews of the PAL and PLA array.

4. An improved condensed single block PLA plus PAL architecture having at least one PLA array having a plurality of Pterm elements each having an input and an output, a plurality of ORterms each having an input and an output, and a plurality of AND gates each having an input coupled to one of said plurality of outputs of said Pterm elements and an output coupled to each of said ORterm elements, and at least one PAL array coupled to said at least one PLA array, said at least one PAL array having a plurality of Pterm elements each having an input and an output, and a plurality of AND gates each having an output, and an input coupled to one of said plurality of outputs of said Pterm elements of said PAL array, the improvement comprising:

disposing the PLA ORterms within the Pterms of the PAL array such that the PAL array with PLA ORterms is disposed adjacent the PLA array, and the PLA Pterm elements are coupled with the PLA ORterm elements through both said PLA array and said PAL array.

5. The improvement according to claim 4, wherein the disposition of the PLA ORterms within the Pterms of the PAL array decreases the amount of die area needed to embody the circuit, and further decreases the propagation delay skew of the single block PAL plus PLA circuit.

* * * * *